(12) United States Patent
Ye et al.

(10) Patent No.: US 10,033,359 B2
(45) Date of Patent: Jul. 24, 2018

(54) AREA EFFICIENT FLIP-FLOP WITH IMPROVED SCAN HOLD-MARGIN

(71) Applicant: QUALCOMM Incorporated, San Diego, CA (US)

(72) Inventors: Qi Ye, San Diego, CA (US); Animesh Datta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/921,341

(22) Filed: Oct. 23, 2015

(65) Prior Publication Data
US 2017/0117884 A1  Apr. 27, 2017

(51) Int. Cl.
H03K 3/037 (2006.01)
H03K 3/356 (2006.01)
H03K 3/3562 (2006.01)

(52) U.S. Cl.
CPC ....... H03K 3/356113 (2013.01); H03K 3/037 (2013.01); H03K 3/0375 (2013.01); H03K 3/35625 (2013.01)

(58) Field of Classification Search
CPC ...... H03K 3/037; H03K 3/0372; H03K 3/356; H03K 3/35625; H03K 3/356104; H03K 3/353; H03K 3/356026; H03K 3/356043; H03K 3/35606
See application file for complete search history.

(56) References Cited

U.S. PATENT DOCUMENTS

| | | | | | |
|---|---|---|---|---|---|
| 4,414,480 | A | * | 11/1983 | Zasio | H03K 19/01855 326/30 |
| 4,568,842 | A | * | 2/1986 | Koike | H03K 3/356104 326/97 |
| 5,041,741 | A | * | 8/1991 | Steele | H03K 19/00361 326/33 |
| 5,065,054 | A | * | 11/1991 | Nguyen | H03K 3/0377 327/311 |
| 5,132,563 | A | * | 7/1992 | Fujii | H01L 27/11807 257/E27.108 |

(Continued)

FOREIGN PATENT DOCUMENTS

JP H01286609 A 11/1989
WO 2008138113 A1 11/2008

OTHER PUBLICATIONS

Anamika Pancholi, Leakage Power Reduction Techniques for CMOS Circuit Design, Dec. 12, 2014.*

(Continued)

*Primary Examiner* — Thomas J Hiltunen
(74) *Attorney, Agent, or Firm* — Arent Fox, LLP and Qualcomm Incorporated (57) ABSTRACT

A method and an apparatus for wireless communication are provided. The apparatus having a first latch having a first latch input and first latch output and a second latch having a second latch input, a second latch scan output, and a second latch data output. The second latch input is coupled to the first latch output. The apparatus further includes a selection component configured to select between a data input and a scan input based on a shift input. The selection component is coupled to the first latch input. The selection component includes a first NAND-gate, a second NAND-gate, and an OR-gate.

8 Claims, 7 Drawing Sheets

(56) References Cited

U.S. PATENT DOCUMENTS

| | | | | |
|---|---|---|---|---|
| 5,179,298 A * | 1/1993 | Hirano | | H03K 17/162 326/27 |
| 5,291,078 A * | 3/1994 | Chao | | H03K 19/0948 326/119 |
| 5,467,044 A * | 11/1995 | Ashe | | H03K 19/00384 326/62 |
| 5,886,901 A | 3/1999 | Magoshi | | |
| 5,990,700 A * | 11/1999 | Park | | H03K 17/162 326/22 |
| 6,021,504 A | 2/2000 | Yamasaki | | |
| 6,140,835 A * | 10/2000 | Shirai | | H03K 3/3565 326/24 |
| 6,198,334 B1 * | 3/2001 | Tomobe | | H03K 5/1252 327/112 |
| 6,275,963 B1 * | 8/2001 | Maeno | | G11C 29/32 714/726 |
| 6,316,301 B1 * | 11/2001 | Kant | | G06F 17/505 257/288 |
| 6,678,846 B1 * | 1/2004 | Maeno | | G01R 31/31854 714/726 |
| 7,138,831 B2 * | 11/2006 | Tobita | | G09G 3/20 326/68 |
| 7,420,391 B2 | 9/2008 | Pesci | | |
| 7,449,924 B2 * | 11/2008 | Vincent | | G06F 13/4291 327/108 |
| 7,590,900 B2 | 9/2009 | Kim et al. | | |
| 7,649,395 B2 | 1/2010 | Ahmadi | | |
| 7,652,520 B2 | 1/2010 | Gatta | | |
| 7,768,315 B2 * | 8/2010 | Cheng | | H03K 19/0016 326/104 |
| 7,793,178 B2 | 9/2010 | Sinha et al. | | |
| 8,339,172 B2 * | 12/2012 | Firmin | | H03K 3/0372 327/202 |
| 8,493,119 B2 | 7/2013 | Leach et al. | | |
| 8,743,251 B2 * | 6/2014 | Ui | | H01L 27/14641 250/208.1 |
| 8,786,344 B2 * | 7/2014 | Salling | | H03K 3/012 327/212 |
| 8,887,015 B2 * | 11/2014 | Iwata | | G06F 17/505 714/726 |
| 9,024,658 B2 | 5/2015 | Shah et al. | | |
| 9,366,727 B2 * | 6/2016 | Gurumurthy | | G01R 31/31854 |
| 2001/0052096 A1 * | 12/2001 | Huijbregts | | G01R 31/31721 714/726 |
| 2002/0070757 A1 * | 6/2002 | La Rosa | | G11C 7/22 326/83 |
| 2002/0194565 A1 * | 12/2002 | Arabi | | G01B 31/31853 714/729 |
| 2004/0090279 A1 * | 5/2004 | Seki | | H03K 3/0307 331/158 |
| 2007/0143384 A1 * | 6/2007 | Muranaka | | G06F 7/588 708/250 |
| 2010/0308864 A1 | 12/2010 | Lee et al. | | |
| 2014/0225655 A1 | 8/2014 | Rasouli et al. | | |
| 2015/0200652 A1 | 7/2015 | Berzins et al. | | |
| 2017/0353186 A1 | 12/2017 | Ye et al. | | |

OTHER PUBLICATIONS

Vaibhav Neema, Novel Circuit Technique for Low Power CMOS design, Jan. 2014, World Academics Journal of Engineering Sciences, World Acad. J. Eng. Sci. 01 2008 (2014).*

Strollo A.G.M., et al., "New Clock-Gating Techniques for Low-Power Flip-flops," Proceedings of the 2000 International Symposium on Low Power Electronics and Design, 2000, pp. 114-119.

Wimer S., et al., "A Look-Ahead Clock Gating Based on Auto-Gated Flip-Flops," IEEE Transactions on Circuits and Systems—I: Regular Papers, May 2014, vol. 61 (5), pp. 1465-1472.

International Search Report and Written Opinion—PCT/US2016/053496—ISA/EPO—dated Dec. 14, 2016.

Strollo A.G.M., et al., "Low-power Flip-flops With Reliable Clock Gating", Microelectronics Journal, Mackintosh Publications Ltd, vol. 32, No. 1, Jan. 1, 2001, XP004219946, ISSN: 0026-2692, DOI: 10.1016/S0026-2692(00) 00072-0, pp. 21-28.

* cited by examiner

AREA EFFICIENT FLIP-FLOP WITH IMPROVED SCAN HOLD-MARGIN

BACKGROUND

Field

The present disclosure relates generally to flip-flop design, and more particularly, to flip-flop circuitry with improved scan hold-margin.

Background

In flip-flop circuits, the minimum setup time for a flip-flop is the minimum amount of time that a data signal needs to be held steady, e.g., held steady at a logic "0" or a logic "1" state, before a clock event, e.g., a rising edge of a clock signal, so that the data is reliably sampled by the clock on a synchronous input signal to the flip-flop. In flip-flop circuits, the minimum hold time is the minimum amount of time the data signal should be held steady, e.g., held steady at a logic "0" or a logic "1" state, after the clock event, e.g., a rising edge of a clock signal, so that the data are reliably sampled on a synchronous input signal to the flip-flop. Hold-margin is an indication of how close the actual hold time of a data signal is to the minimum hold time of the data signal.

In some semiconductor process technologies, it is becoming difficult to ensure there is enough hold-margin between launch and capture flip-flops. Ensuring that there is enough hold-margin between launch and capture flip-flops may be especially difficult for scan-paths that tend to have shallow logic depths, i.e., where the number of logic gates between an input of a logic function and an output of a logic function is small such that the delay through such logic gates is small relative to the hold-margin of the flip-flops.

The difficulty with ensuring that there is enough hold-margin between launch and capture flip-flops can be due to increased process variation from smaller geometries. The difficulty with ensuring that there is enough hold-margin between launch and capture flip-flops may be further aggravated by the fact that smaller technology/fin field effect transistor (FinFET) devices may be faster.

In FinFET technologies or other semiconductor process technologies, issues with hold-margin may lead to an increase in the number of buffers used. For example, some circuitry may have four times to five times more buffers as compared to earlier semiconductor process technologies. An increased number of buffers may be used to avoid hold violations. Increasing the number of buffers used to address issues with hold-margin, however, may increases area used on a semiconductor die, increase leakage current, increase dynamic power overhead, or some combination of these. Accordingly, addressing issues with hold-margin in a more area efficient way, a more power efficient way, or both may improve the flip-flop design.

SUMMARY

In an aspect of the disclosure, a method and an apparatus are provided. The apparatus having a first latch having a first latch input and first latch output and a second latch having a second latch input, a second latch scan output, and a second latch data output. The second latch input is coupled to the first latch output. The apparatus further includes a selection component configured to select between a data input and a scan input based on a shift input. The selection component is coupled to the first latch input. The selection component includes a first NAND-gate having a first-NAND-gate first input, a first-NAND-gate second input, and a first-NAND-gate output. The first-NAND-gate output is coupled to the first latch input. The first-NAND-gate first input is configured to receive the data input and the shift input. The selection component also includes a second NAND-gate having a second-NAND-gate first input, a second-NAND-gate second input, and a second-NAND-gate output. The second-NAND-gate output is coupled to the first-NAND-gate second input. The second-NAND-gate first input is coupled to the shift input. The second-NAND-gate second input is configured to receive the scan input. The selection component further includes an OR-gate having an OR-gate first input, an OR-gate second input, and an OR-gate output. The OR-gate output is coupled to the first-NAND-gate first input. The OR-gate first input is coupled to the data input. Additionally, the OR-gate second input is coupled to the shift input.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As discussed above, in FinFET technologies or other semiconductor process technologies, issues with hold-margin may lead to an increase in the number of buffers used. The buffers may be placed between output of the launch latch and the input of the capture latch. Buffers may be used to provide delay in the data path, the scan path, or both. Generally, however, more buffers may be needed for the scan path of a flip-flop design when compared to the data path of a flip-flop design. The data path in a design may include more logic circuitry that may be used to process the data. Accordingly, fewer other delays may be needed because the logic circuitry that may be used to process the data may provide delays in place of any need for buffer circuitry. As the buffers become faster they may be less effective in dealing with issues with hold-margin between the launch latch and the input of the capture latch.

Because the buffers are intended to delay signals through them, as speeds of circuitry increases with improvements in semiconductor technology, more buffers may be needed to provide the delay needed. While an increased number of buffers may be used to avoid hold violations, increasing the number of buffers used may increase area used on a semiconductor die, increase leakage current, increase dynamic power overhead, or some combination of these. Accordingly, addressing issues with hold-margin in a more area efficient way, a more power efficient way, or both may improve the flip-flop design.

The systems and methods described herein may provide area efficient, power efficient, or both area efficient and power efficient ways to increase hold-margin. These systems and methods may reduce the hold time requirement and may provide a more area efficient delay element in, for example, the scan path. The systems and methods described herein may reduce the scan-input hold time, increase clock-to-scan-output delay, or do both.

Figure 1:
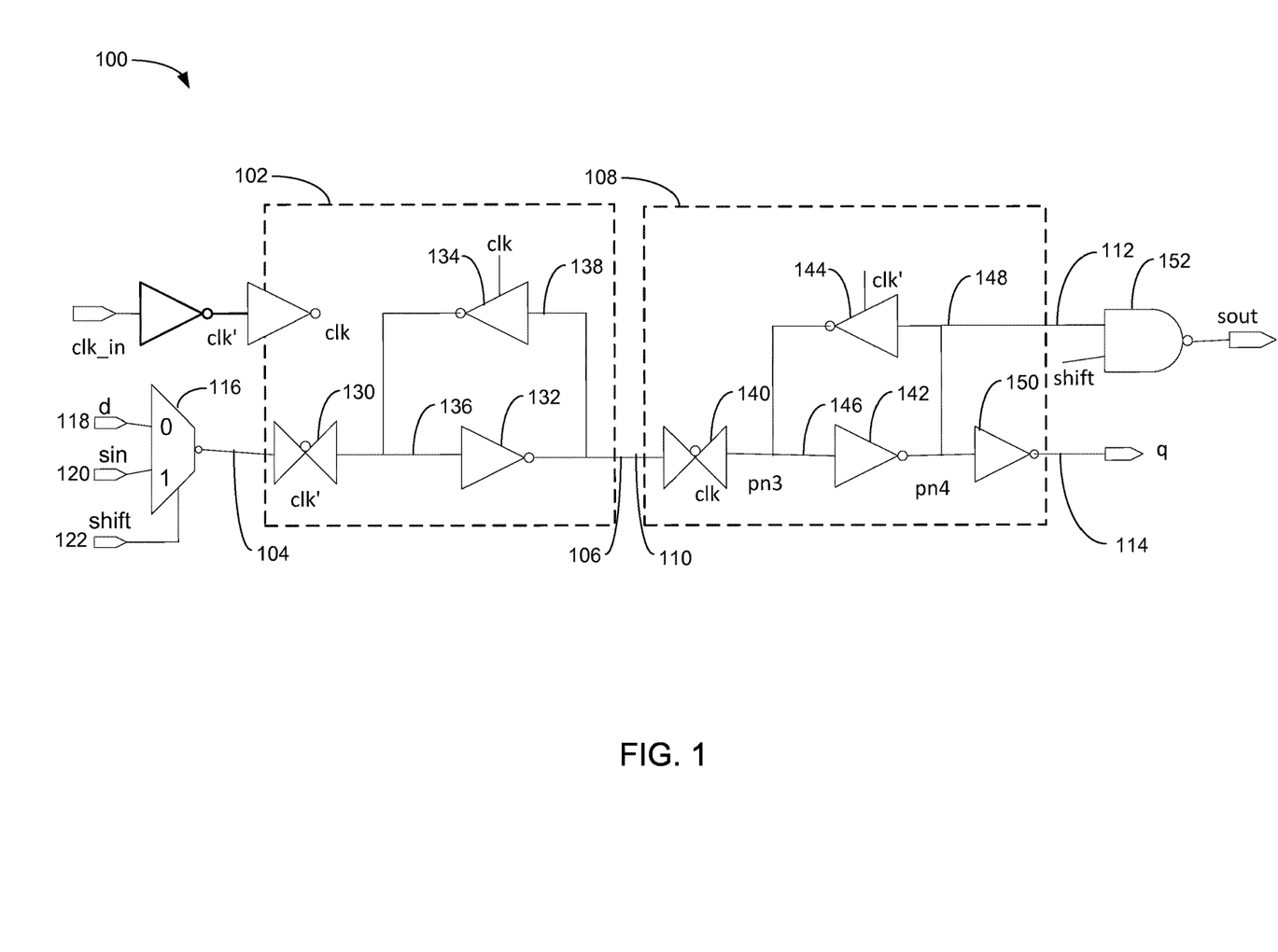
FIG. 1 is a circuit diagram illustrating an example flip-flop design.

FIG. 1 is a circuit diagram 100 illustrating an example flip-flop design. The example flip-flop design of FIG. 1 includes a first latch 102 having a first latch input 104 and first latch output 106. The example flip-flop design also includes a second latch 108 having a second latch input 110, a second latch scan output 112, and a second latch data output 114. The second latch input 110 is coupled to the first latch output 106.

The example flip-flop design of FIG. 1 includes a multiplexer 116 (also referred to as a mux) configured to select between a data input (d) 118 and a scan input (sin) 120 based on a shift input 122. The multiplexer 116 is coupled to the first latch input 104. Accordingly, the multiplexer passes either the data input 118 or the scan input 120 to the first latch input 104 based on a shift input 122.

In the example of FIG. 1, the first latch 102 includes a first transmission gate 130 coupled between the first latch input 104 and a first node 136. The first transmission gate 130 is clocked by a clock signal clk'. A first inverter 132 is coupled between the first node 136 and a second node 138. The second node 138 is connected to the first latch output 106. Additionally, a second inverter 134 is coupled between the second node 138 and the first node 136. The second inverter 134 is a tri-state inverter clocked by the clock signal clk. As illustrated in FIG. 1, the input clock, clk_in, is inverted to generate the clk' clock signal. The clk' clock signal is inverted to generate the clk clock signal.

The second latch 108 includes a first transmission gate 140 coupled between the second latch input 110 (which is coupled to the first latch output 106) and a first node 146. The first transmission gate 140 is clocked by a clock signal clk. A first inverter 142 is coupled between the first node 146 and a second node 148. A second inverter 144 is coupled to the second node 148 and the second latch scan output 112. The second inverter 144 is a tri-state inverter clocked by the clock signal clk'. The second inverter 144 is coupled between the second node 148/second latch scan output 112 and the first node 146. Again, as illustrated in FIG. 1, the input clock, clk_in, is inverted to generate the clk' clock signal. The clk' clock signal is inverted to generate the clk clock signal. Accordingly, the first transmission gate 140 and the second inverter 144 will be active on opposite edges of the input clock, clk_in, assuming the first transmission gate 140 and the second inverter 144 are both active on the rising edge of a clock signal or both active on a falling edge of a clock signal. The signal on the second node 148 is inverted by a third inverter 150 to form the second latch data output (q) 114. The signal on the second latch scan output 112 is coupled to a NAND-gate 152, and the second latch scan output 112 is allowed to pass through the NAND-gate 152 based on the shift signal to generate a scan output (sout) signal. The shift signal is also an input of NAND-gate 152.

Figure 2A:
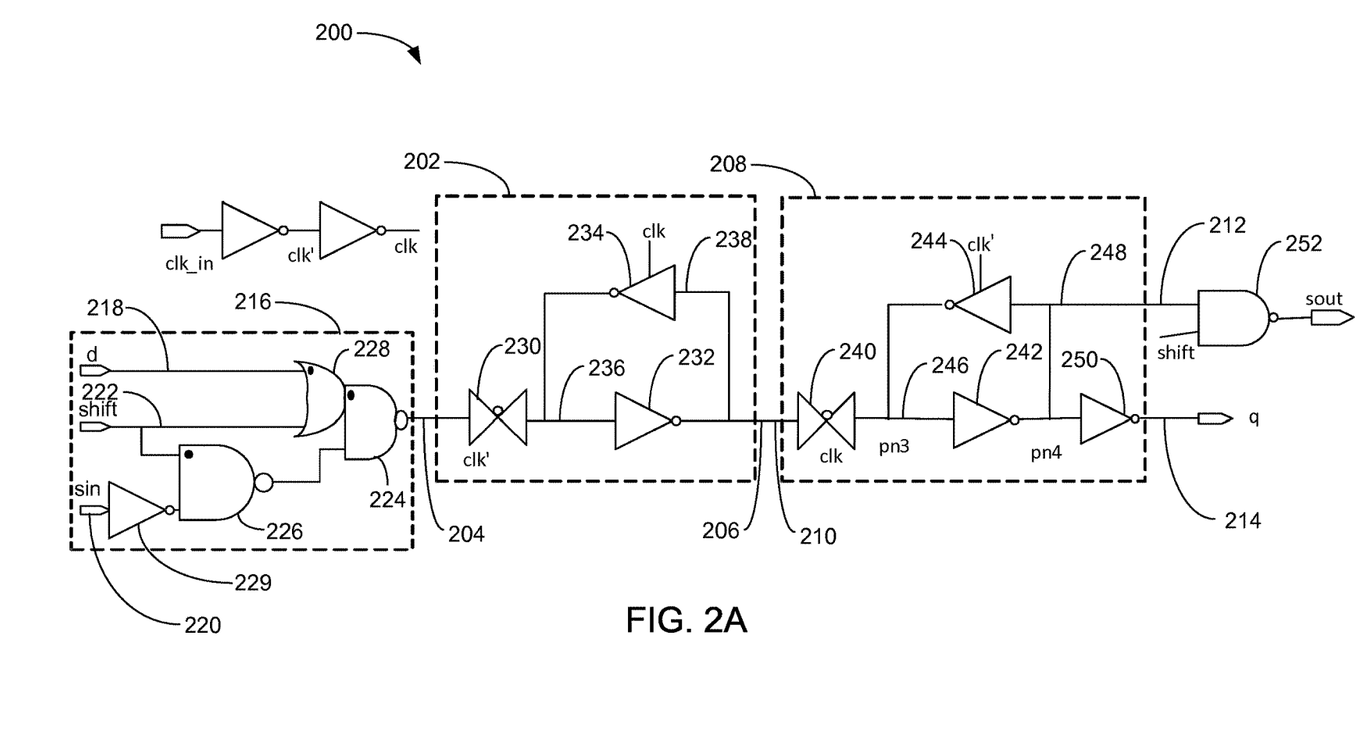
FIG. 2A is a circuit diagram illustrating an example flip-flop design in accordance with this disclosure.

The example of FIG. 1 illustrates a 1-stage scan input delay (through the multiplexer 116). As described herein above, some semiconductor process technologies may have issues with hold-margin. Accordingly, it may be advantageous to have more delay stages, as is described with respect to FIGS. 2 and 3 which illustrate example flip-flop designs in accordance with this disclosure. The flip-flop designs of FIGS. 2 and 3 may address issues with hold-margin in a more area efficient way, a more power efficient way, or both when compared to adding additional buffers to a flip-flop design.

FIG. 2A is a circuit diagram 200 illustrating an example flip-flop design in accordance with this disclosure. The example flip-flop design of FIG. 2A includes a first latch 202 having a first latch input 204 and first latch output 206. The example flip-flop design also includes a second latch 208 having a second latch input 210, a second latch scan output 212, and a second latch data output (q) 214. The second latch input 210 is coupled to the first latch output 206.

The example flip-flop design of FIG. 2A includes a selection component 216 configured to select between a data input (d) 218 and a scan input (sin) 220 based on a shift input 222. The selection component 216 is coupled to the first latch input 204. In the example flip-flop design of FIG. 2A, the selection component 216 includes a first NAND-gate 224 having a first-NAND-gate first input, a first-NAND-gate second input, and a first-NAND-gate output. The first-NAND-gate output is coupled to the first latch input 204. Additionally, the first-NAND-gate first input may be configured to receive the data input 218 and the shift input 222.

Additionally, in the example flip-flop design of FIG. 2A, the selection component 216 includes a second NAND-gate 226 having a second-NAND-gate first input, a second-NAND-gate second input, and a second-NAND-gate output. The second-NAND-gate output is coupled to the first-NAND-gate 224 second input. The second-NAND-gate 226 first input is coupled to the shift input 222. The second-NAND-gate 226 second input is configured to receive the scan input 220.

Figure 2B:
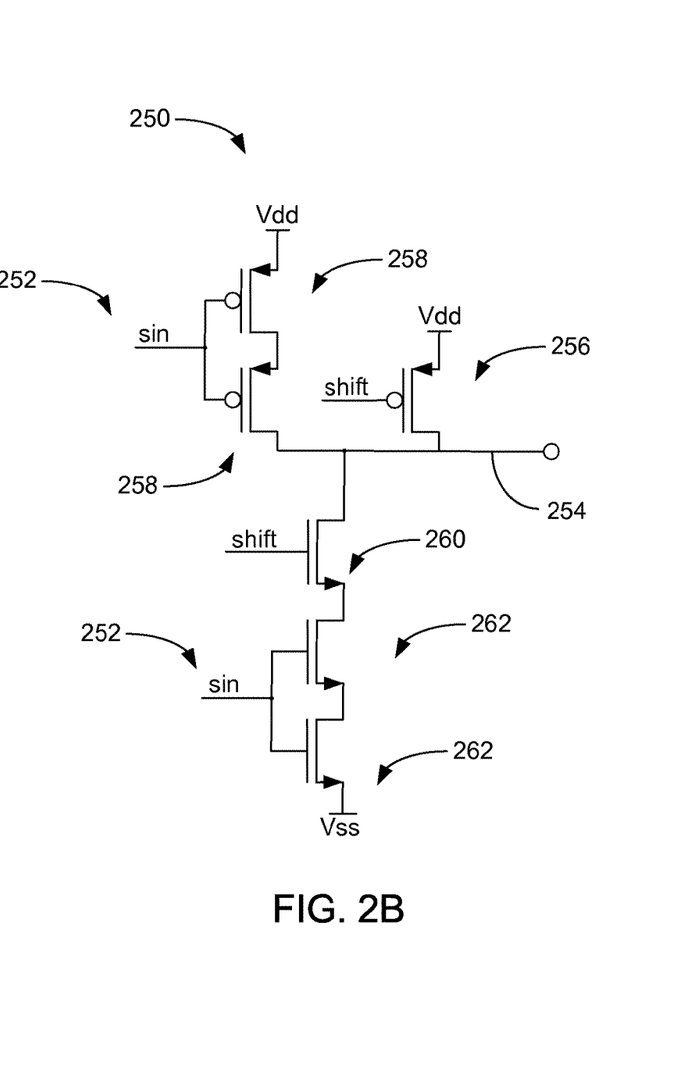
FIG. 2B is a circuit diagram illustrating an example complementary metal oxide semiconductor (CMOS) NAND gate with stacked transistors that may be used in conjunction with the example flip-flop designs of FIGS. 2A and 3.

In some examples, the second NAND-gate 226 includes at least one p-type MOS (pMOS) transistor coupled to the shift input 222, a set of pMOS transistors coupled to the scan input 220, at least one n-type MOS (nMOS) transistor coupled to the shift input 222, and a set of nMOS transistors coupled to the scan input 220. The set of pMOS transistors coupled to the scan input 220 may be stacked in series. The set of nMOS transistors coupled to the scan input may also be stacked in series. An example of a NAND gate includes stacked pMOS transistors and stacked nMOS transistors is illustrated in FIG. 2B, discussed below.

In the example flip-flop design of FIG. 2A, the selection component 216 also includes an OR-gate 228 having an OR-gate first input, an OR-gate second input, and an OR-gate output. The OR-gate 228 output is coupled to the first-NAND-gate 224 first input. The OR-gate 228 first input is coupled to the data input 218. The OR-gate 228 second input is coupled to the shift input 222.

Figure 2C:
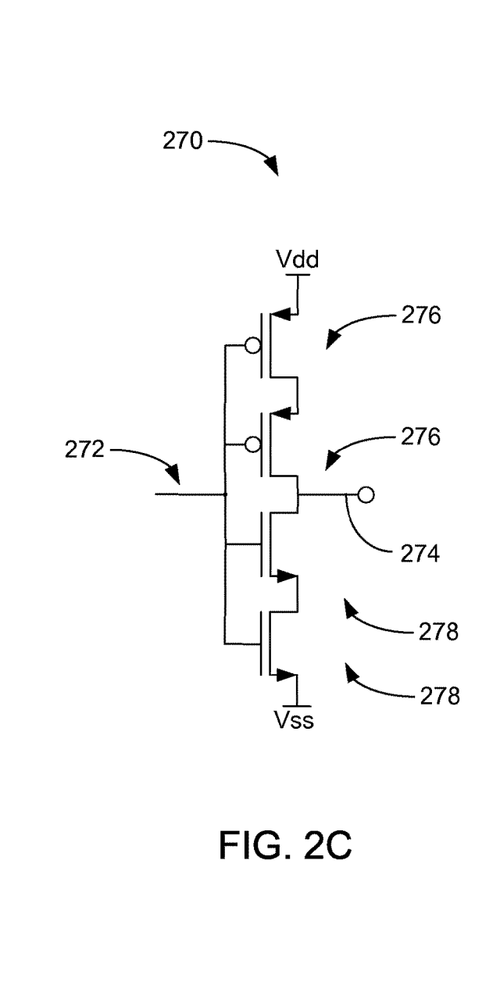
FIG. 2C is a circuit diagram illustrating an example CMOS inverter with stacked transistors that may be used in conjunction with the example flip-flop designs of FIG. 2A.

As illustrated in FIG. 2A, the selection component 216 of the example flip-flop design includes an inverter 229 having an inverter input and an inverter output. The inverter input is coupled to the scan input 220. The inverter output is coupled to the second-NAND-gate 226 second input. In some examples, the inverter 229 may include a plurality of stacked pMOS transistors in series and a plurality of stacked nMOS transistors in series. An example of an inverter including stacked pMOS transistors and stacked nMOS transistors is illustrated in FIG. 2C, discussed below.

In the example of FIG. 2A, the first latch 202 includes a first transmission gate 230 coupled between the first latch input 204 and a first node 236. The first transmission gate 230 is clocked by a clock signal clk'. A first inverter 232 is coupled between the first node 236 and a second node 238. The second node 238 is connected to the first latch output 206. Additionally, a second inverter 234 is coupled between the second node 238 and the first node 236. The second inverter 234 is tri-state inverter clocked by the clock signal clk. As illustrated in FIG. 2A, the input clock, clk_in, is inverted to generate the clk' clock signal. The clk' clock signal is inverted to generate the clk clock signal.

The second latch 208 includes a first transmission gate 240 coupled between the second latch input 210 (which is coupled to the first latch output 206) and a first node 246. The first transmission gate 240 is clocked by a clock signal clk. A first inverter 242 is coupled to the first node 246 and a second node 248. A second inverter 244 is coupled to the second node 248 and the second latch scan output 212. The second inverter 244 is a tri-state inverter clocked by the clock signal clk'. The second inverter 244 is coupled between the second node 248/second latch scan output 212 and the first node 246. Again, as illustrated in FIG. 2A, the input clock, clk_in, is inverted to generate the clk' clock signal. The clk' clock signal is inverted to generate the clk clock signal. Accordingly, the first transmission gate 240 and the second inverter 244 will be active on opposite edges of the input clock, clk_in, assuming the first transmission gate 240 and the second inverter 244 are both active on the rising edge of a clock signal or both active on a falling edge of a clock signal. A third inverter 250 is coupled between the second node 248 and the second latch data output 214. Accordingly, the signal on the second node 248 is inverted by the third inverter 250 to form the second latch data output 214. The signal on the second latch scan output 212 is coupled to a NAND-gate 252, and the second latch scan output 212 is allowed to pass through the NAND-gate 252 based on the shift signal to generate a scan output (sout) signal. The shift signal is also an input of NAND-gate 252.

The example flip-flop design of FIG. 2A may be easier to layout than the flip-flop design of FIG. 1. Additionally, the data path through the selection circuitry may be faster (as compared to the design of FIG. 1), which may improve performance, while the scan-path through the selection circuitry may have two more stages of logic delay hold margin (as compared to the design of FIG. 1) making the scan path slower and improving scan-path hold-margin. The example flip-flop design of FIG. 2A includes two more devices than the baseline design of FIG. 1, but may be realized using a one grid of area increase or less due to fewer oxide diffusion (OD) breaks. Additionally, the example flip-flop design of FIG. 2A has no cross-coupled gate connection as in the multiplexer design of FIG. 1. Additionally, the example flip-flop design of FIG. 2A has two stages more scan hold margin as compared to the example flip-flop design of FIG. 1. The example flip-flop design of FIG. 2A has three stages of scan hold margin while the example flip-flop design of FIG. 1 only has a single stage of scan hold margin. Additionally, the NAND gate 226 may include stacked transistors in the scan input path to slow down the NAND gate 226 in the scan input path to further improve the scan hold margin as illustrated in FIG. 2B discussed below. Further, the scan input inverter 229 may include stacked transistors to slow down the inverter 229 and to further improve the scan hold margin as illustrated in FIG. 2C discussed below.

Figure 3:
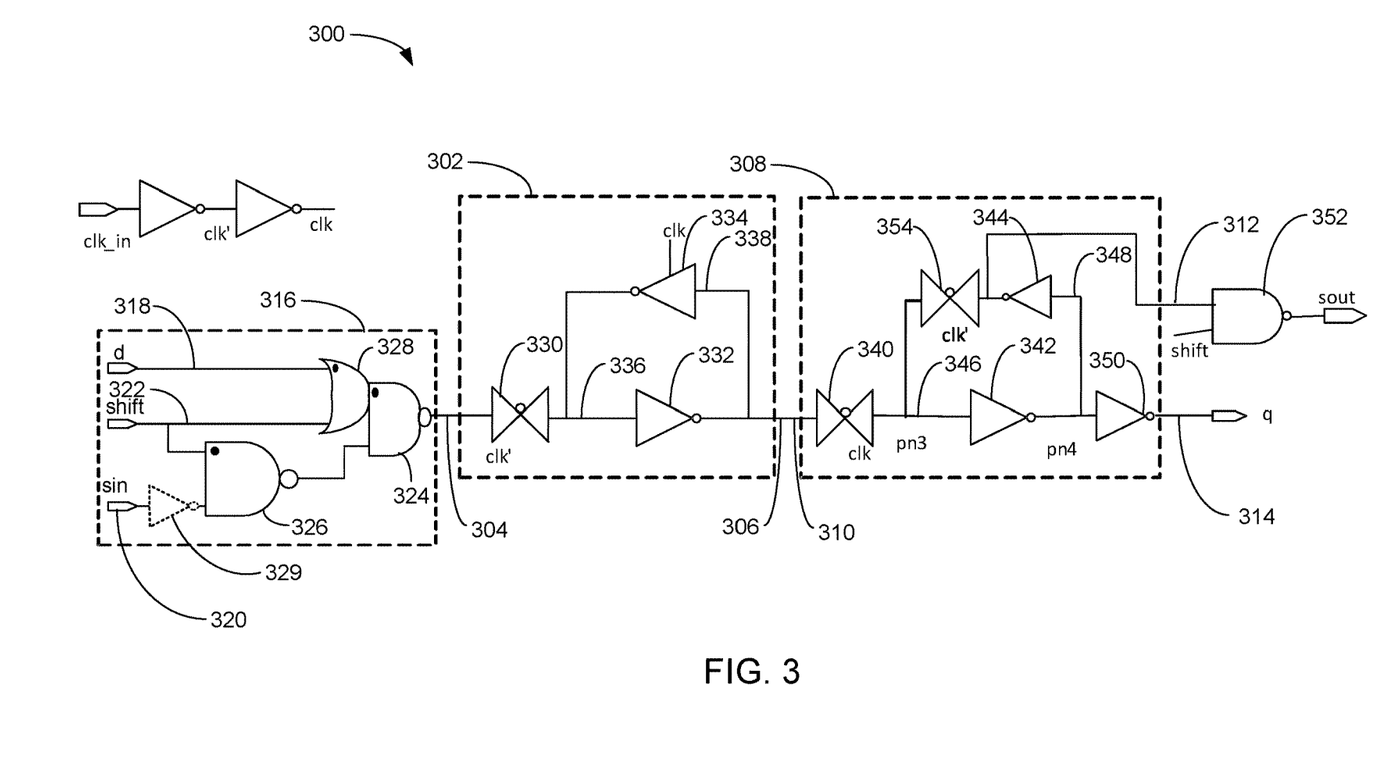
FIG. 3 is another circuit diagram illustrating an example flip-flop design in accordance with this disclosure.

FIG. 2B is a circuit diagram 250 illustrating an example CMOS NAND gate with stacked transistors 258, 262 that may be used in conjunction with the example flip-flop designs of FIGS. 2A and 3 as well as other example flip-flop designs that include selection circuitry such as selection devices 216, 316. As illustrated in FIG. 2B, the NAND gate with stacked transistors is generally similar to a CMOS NAND gate without stacked transistors, however, the scan input 252 of the example CMOS NAND gate has transistors that are stacked. A stacked input uses two (or more) pMOS transistors/nMOS transistors in series instead of one pMOS transistor/nMOS transistor.

In one example, an output 254 of the CMOS NAND gate may be connected to a latch such as latch 202 of FIG. 2A. Stacking the transistors in the scan input path may slow down the circuitry in the scan input path. Slowing the circuitry down in the scan input path may improve hold margins in relation to the scan input path at a latch connected or coupled to the CMOS NAND gate. For example, if the NAND gate 226 is coupled to a latch such as latch 202, e.g., through NAND gate 224, then changes in the logical value of the signal through the stacked input will not change at the latch input of, e.g., latch 202 of FIG. 2A, until a longer time after a clock edge due to the increased delay though the stacked input. In the illustrated example of FIG. 2B, the propagation of the scan input (sin) signal (or inverted scan input ($\overline{sin}$) signal) through the CMOS NAND gate is delayed due to the stacking. Accordingly, changes in the output 254 may be delayed though the stacked input, improving the hold margin at a latch 202 for the scan input signal.

As illustrated in FIG. 2B, in some examples, the second NAND-gate 226 may include at least one pMOS transistor 256 coupled to the shift input 222. The second NAND-gate 226 may also include a set of pMOS transistors 258 coupled to the scan input 220 (sin/$\overline{sin}$). The second NAND-gate 226 may include at least one nMOS transistor 260 coupled to the shift input 222. The second NAND-gate 226 may further include a set of nMOS transistors 262 coupled to the scan input 220 (sin/$\overline{sin}$). The set of pMOS transistors 258 coupled to the scan input 220 may be stacked in series. The set of nMOS transistors 262 coupled to the scan input 220 may be stacked in series.

FIG. 2C is a circuit diagram 270 illustrating an example inverter with stacked transistors that may be used in conjunction with the example flip-flop designs of FIG. 2A as well as other example flip-flop designs that include selection circuitry such as selection devices 216 with an inverter such as the inverter 229 of FIG. 2A. As illustrated in FIG. 2C, the CMOS inverter with stacked transistors is generally similar to a CMOS inverter that does not include stacked transistors, however, the input 272 of the example CMOS inverter includes stacked transistors. As discussed above, a stacked input uses two (or more) pMOS transistors/nMOS transistors in series instead of one pMOS transistor/nMOS transistor. The example inverter of FIG. 2C includes a plurality of stacked pMOS transistors 276 in series, and a plurality of stacked nMOS transistors 278 in series.

In one example, an output 274 of the CMOS inverter may be coupled to a latch. For example, the output of CMOS inverter 229 is coupled to the input of the first latch 204 through NAND gates 226, 224. Stacking the transistors in the CMOS inverter may slow down the circuitry in the scan input path. Slowing the circuitry down in the scan input path may improve hold margins with respect to the scan input path at a latch connected or coupled to the CMOS inverter. For example, if the CMOS inverter is connected/coupled to a latch, such as latch 202 of FIG. 2A through NAND gate 226, then changes in that signal will not impact the latch input of, e.g., latch 202 of FIG. 2A, until a longer time after a clock edge due to the increased delay though the stacked input. In the illustrated example of FIG. 2C, the propagation of the scan input (sin) signal through the CMOS inverter with stacked transistors is delayed due to the stacking. Accordingly, changes in the output 274 may be delayed though the stacked input, improving the hold margin at a latch 202 for the scan input signal.

FIG. 3 is another circuit diagram 300 illustrating an example flip-flop design in accordance with this disclosure. The example flip-flop design of FIG. 3 includes a first latch 302 having a first latch input 304 and first latch output 306. The example flip-flop design also includes a second latch 308 having a second latch input 310, a second latch scan output 312, and a second latch data output (q) 314. The second latch input 310 is coupled to the first latch output 306.

The example flip-flop design of FIG. 3 includes a selection component 316 configured to select between a data input (d) 318 and a scan input (sin) 320 based on a shift input 322. The selection component 316 is coupled to the first latch input 304. In the example flip-flop design of FIG. 3, the selection component 316 includes a first NAND-gate 324 having a first-NAND-gate first input, a first-NAND-gate second input, and a first-NAND-gate output. The first-NAND-gate output is coupled to the first latch input 304. The first-NAND-gate first input may be configured to receive the data input 318 and the shift input 322.

Additionally, in the example flip-flop design of FIG. 3, the selection component 316 includes a second NAND-gate 326 having a second-NAND-gate first input, a second-NAND-gate second input, and a second-NAND-gate output. The second-NAND-gate output is coupled to the first-NAND-gate 324 second input. The second-NAND-gate 326 first input is coupled to the shift input 322. The second-NAND-gate 326 second input is configured to receive the scan input 320.

In some examples, the second NAND-gate 326 includes at least one pMOS transistor coupled to the shift input 322, a set of pMOS transistors coupled to the scan input 320, at least one nMOS transistor coupled to the shift input 322, and a set of nMOS transistors coupled to the scan input 320. The set of pMOS transistors coupled to the scan input 320 may be stacked in series. The set of nMOS transistors coupled to the scan input may also be stacked in series. An example of a NAND gate including stacked pMOS transistors and stacked nMOS transistors is illustrated in FIG. 2B discussed above.

In the example flip-flop design of FIG. 3, the selection component 316 also includes an OR-gate 328 having an OR-gate first input, an OR-gate second input, and an OR-gate output. The OR-gate 328 output is coupled to the first-NAND-gate 324 first input. The OR-gate 328 first input is coupled to the data input 318. The OR-gate 328 second input is coupled to the shift input 322.

In the example of FIG. 3, the first latch 302 includes a first transmission gate 330 coupled between the first latch input 304 and a first node 336. The first transmission gate 330 is clocked by a clock signal clk'. A first inverter 332 is coupled between the first node 336 and a second node 338. The second node 338 is connected to the first latch output 306. Additionally, a second inverter 334 is coupled between the second node 338 and the first node 336. The second inverter 334 is a tri-state inverter clocked by the clock signal clk. As illustrated in FIG. 2A, the input clock, clk_in, is inverted to generate the clk' clock signal. The clk' clock signal is inverted to generate the clk clock signal.

The second latch 308 includes a first transmission gate 340 coupled between the second latch input 310 (which is coupled to the first latch output 306) and a first node 346. The first transmission gate 340 is clocked by a clock signal clk. A first inverter 342 is coupled to the first node 346 and a second node 348. A second inverter 344 is coupled to the second node 348 and the second latch scan output 312. The output of the second inverter 344 (the second latch scan output 312) is coupled to a second transmission gate 354, which is clocked by the clock signal clk'. The second transmission gate 354 connects the second latch scan output 312 to the first node 346. Again, as illustrated in FIG. 3, the input clock, clk_in, is inverted to generate the clk' clock signal. The clk' clock signal is inverted to generate the clk clock signal. Accordingly, the first transmission gate 340 and the second transmission gate 354 will be active on opposite edges of the input clock, clk_in, assuming the first transmission gate 340 and the second transmission gate 354 are both active on the rising edge of a clock signal or both active on a falling edge of a clock signal. A third inverter 350 is coupled between the second node 348 and the second latch data output 314. Accordingly, the signal on the second node 348 is inverted by the third inverter 350 to form the second latch data output 314. The signal on the second latch scan output 312 is coupled to a NAND-gate 352, and the second latch scan output 312 is allowed to pass through the NAND-gate 352 based on the shift signal to generate a scan output (sout) signal. The shift signal is also an input of NAND-gate 352.

The example flip-flop design of FIG. 3 may have some or all of the benefits when compared to the flip-flop design of FIG. 1 that the example flip-flop design of FIG. 2A has. For example, the data path of the selection circuitry 316 may be faster (when compared to the design of FIG. 1), which may improve performance. However, the scan-path of the selection circuitry 316 has one additional stage of logic delay hold margin when compared to the flip-flop design of FIG. 1, which adds delay, making the scan-path slower, which may help scan-path (sin-sout) hold-margin. The selection circuitry 316 has two stages of logic delay hold margin while the example flip-flop design of FIG. 1 only has a single stage of scan hold margin. Additionally, the example flip-flop design of FIG. 3 may have some benefits when compared to the flip-flop design of FIG. 2A. The example flip-flop design of FIG. 3 may have the same hold margin benefit as the example flip-flop design of FIG. 2A, but with better performance. The example flip-flop design of FIG. 3 has the same device count as in the baseline design of FIG. 1, which is two less devices than the example flip-flop design of FIG. 2A. Furthermore, the example flip-flop design of FIG. 3 may reduce loading of the clock to output path. There is an optional inverter 329 on the scan input 320 to the NAND gate 326. The example flip-flop design of FIG. 3 is a two-stage scan-in delay design when the optional inverter 329 is omitted). (The example flip-flop design of FIG. 2A is a three-stage scan-in delay design.) The lack of an inverter on the scan input 320 may be taken into consideration in any logic design after the second latch data output 314, which is the "q" output of the flip-flop design of FIG. 3. The second latch data output 314 will be inverted with respect to the second latch data output 114, 214 of FIGS. 1 and 2, during scan mode only, i.e., when shift=1.

In some examples, the proposed options may provide a fine-grain scan hold fix solution without the overhead of an engineering change order (ECO) for adding hold buffers to improve the hold margin. Accordingly, some examples may provide a 50% to 75% smaller area overhead when compared to solutions that use buffer insertion alone. Additionally, a 50% to 75% smaller area leakage and dynamic power over-head decrease may be provided when compared to a flip-flop design including hold buffer insertion or other existing options.

Aspects of the designs of FIGS. 2A and 3 may be combined in various ways to have solutions with different transistor counts, input multiplexer topologies, or scan output topologies. FIG. 1 may be considered a baseline. The baseline design of FIG. 1 has a transistor count of 40. As described herein, the baseline design of FIG. 1 uses a tri-state multiplexer 116 as the input multiplexer topology. The baseline design of FIG. 1 uses a normal two-input NAND gate scan output topology. The baseline design of FIG. 1 provides the baseline hold margin and performance.

In another example, the example flip-flop design of FIG. 2A may be modified by removing the inverter 229. Accordingly, a similar example to the flip-flop design illustrated with respect to FIG. 2A, but without the inverter 229 is provided in accordance with the systems and methods described herein. Such a design also has a transistor count of 40. The input multiplexer topology is generally similar to the selection component 216, but without inverter 229. Accordingly, the input multiplexer topology is generally similar to the selection circuitry 316 of FIG. 3. This design uses a normal two-input NAND gate scan output topology. When compared to the baseline design of FIG. 1, the design that is similar to the flip-flop design illustrated with respect to FIG. 2A, but without the inverter 229 may have a hold margin gain of 0.6 buffers and no performance increase over the baseline, i.e., performance of 1.00.

The flip-flop design illustrated with respect to FIG. 2A has a transistor count of 42. The input multiplexer topology is illustrated in FIG. 2A, the selection circuitry includes the inverter 229, NAND-gates 224, 226, and OR-gate 228. This design uses a normal two-input NAND gate scan output topology. When compared to the baseline design of FIG. 1, the design of FIG. 2A may have a hold margin gain of 1 buffer and no performance increase over the baseline, i.e., performance of 1.00.

The flip-flop design illustrated with respect to FIG. 3 has a transistor count of 40. The input multiplexer topology is the selection circuitry 316 of FIG. 3. This design uses the scan output topology illustrated in FIG. 3. When compared to the baseline design of FIG. 1, the design with respect to FIG. 3 may have a hold margin gain of 1 buffer and a performance increase over the baseline of 1.03.

The design illustrated in FIG. 3, may include the optional inverter 329 in the selection circuitry 316. The selection circuitry 316, when optional inverter 329 is included, may generally be similar to the selection component 216 of FIG. 2A. Such a design has a transistor count of 42. This design uses the scan output topology illustrated in FIG. 3. When compared to the baseline design of FIG. 1, this design may have a hold margin gain of 1.5 buffers and a performance increase over the baseline of 1.03.

Figure 4:
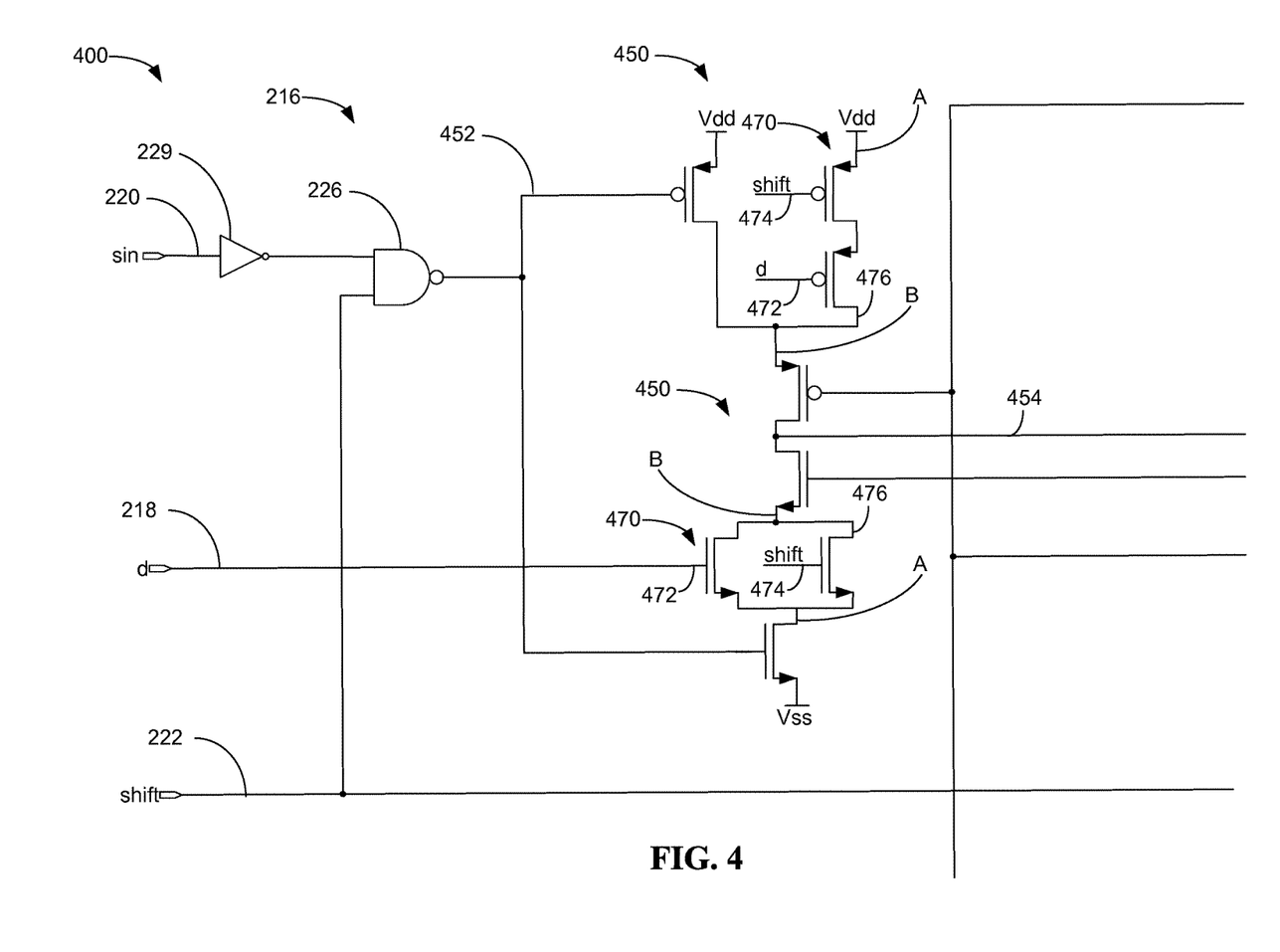
FIG. 4 is a circuit diagram illustrating the selection component of FIG. 2A in accordance with this disclosure.

FIG. 4 is a circuit diagram 400 illustrating one example of the selection component 216 of FIG. 2A in accordance with this disclosure. As illustrated in FIG. 4, the selection component 216 is configured to select between a data input (d) 218 and a scan input (sin) 220 based on a shift input 222. The selection component 216 may be coupled to the first latch input as illustrated in FIG. 2A. The selection component may include a first NAND-gate 450 having a first-NAND-gate first input (between nodes "A" and "B"), a first-NAND-gate second input 452, and a first-NAND-gate output at node "B." The first-NAND-gate output at node "B" may be coupled to the first latch input (e.g., the first latch input 204 of FIG. 2A), through a transmission gate between node "B" and output 454. The first-NAND-gate first input (between nodes "A" and "B") may be configured to receive the data input and the shift input.

The selection component 216 may include a second NAND-gate 226 having a second-NAND-gate first input, a second-NAND-gate second input, and a second-NAND-gate output. The second-NAND-gate output may be coupled to the first-NAND-gate second input 452. The second-NAND-gate first input may be coupled to the shift input 222. The second-NAND-gate second input may be configured to receive the scan input 220 (sin/$\overline{\text{sin}}$).

The selection component 216 may include an OR-gate 470 having an OR-gate first input 472, an OR-gate second input 474, and an OR-gate output 476. The OR-gate output 476 may be coupled to the first-NAND-gate first input (between nodes "A" and "B"). The OR-gate first input 472 may be coupled to the data input 218. The OR-gate second input 474 may be coupled to the shift input 222.

Figure 5:
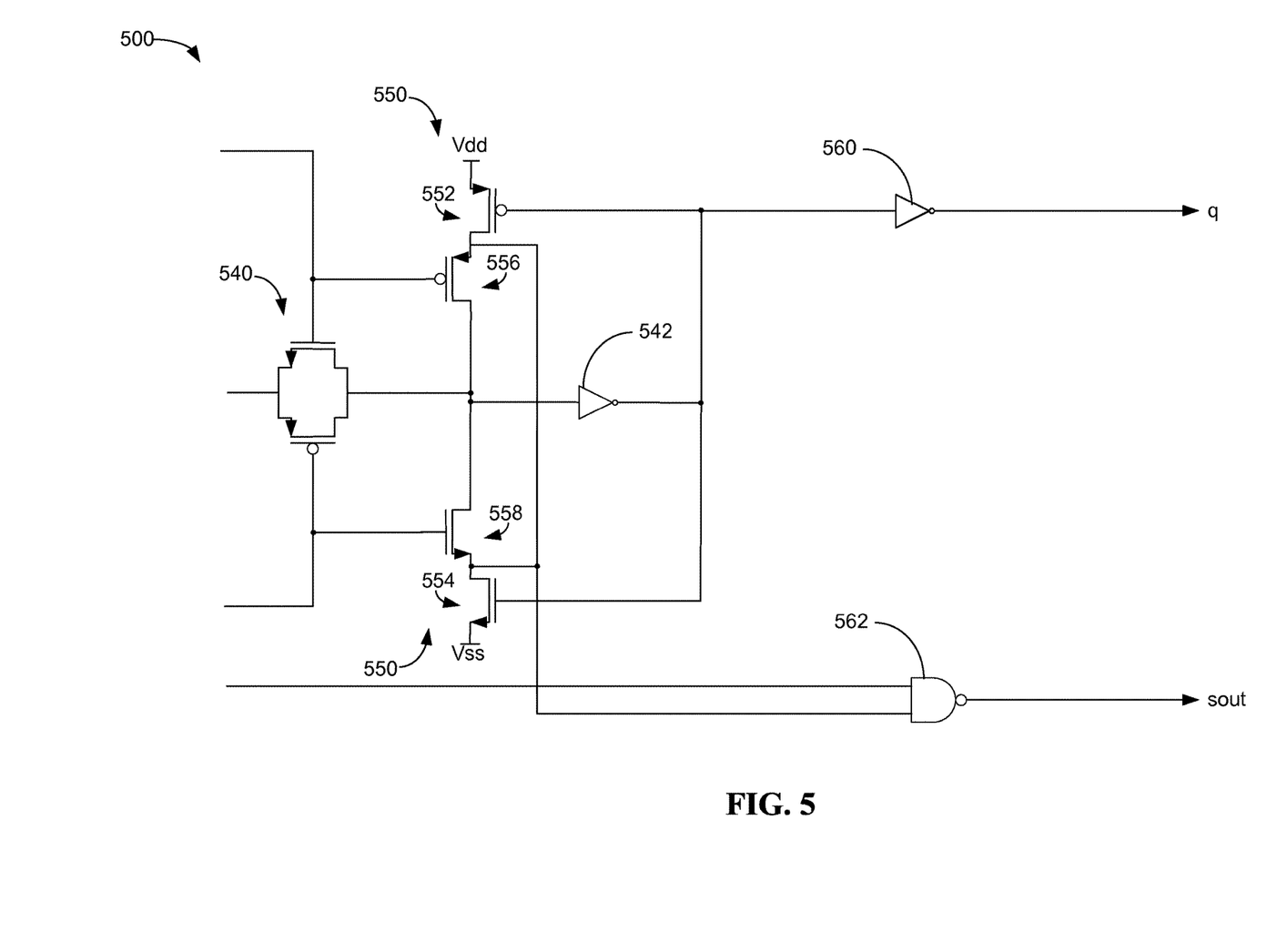
FIG. 5 is a circuit diagram illustrating the scan output circuitry of FIG. 3 in accordance with this disclosure.

FIG. 5 is a circuit diagram 500 illustrating one example of the scan output circuitry of FIG. 3 in accordance with this disclosure. As illustrated in FIG. 5, the inverter 542 may generally be the equivalent inverter to the first inverter 342 of FIG. 3. The inverter 560 may generally be the equivalent inverter to the third inverter 350 of FIG. 3. The NAND-gate 562 may generally be the equivalent NAND gate to the NAND-gate 352 of FIG. 3. The transmission gate 540 may generally be equivalent to the first transmission gate 340 of FIG. 3. The second inverter 344 and the second transmission gate 354 of FIG. 3 may be implemented using circuitry 550 of FIG. 5. The second inverter 344 may generally be implemented using transistors 552, 554. The second transmission gate 354 may generally be implemented using transistors 556, 558.

Some examples described herein relate to an apparatus including a first latch (202; 302) having a first latch input (204; 304) and first latch output (206; 306). Additionally, the apparatus may include a second latch (208; 308) having a second latch input (210; 310), a second latch scan output (212; 312), and a second latch data output (214; 314). The second latch input (210; 310) may be coupled to the first latch output (206; 306).

The apparatus may also include a selection component (216; 316) configured to select between a data input (218; 318) and a scan input (220; 320) based on a shift input (222; 322). The selection component (216; 316) may be coupled to the first latch input (204; 304).

Furthermore, the selection component (216; 316) may include a first NAND-gate (224; 324; 450) having a first-NAND-gate first input (between nodes "A" and "B" illustrated in FIG. 4), a first-NAND-gate second input (452), and a first-NAND-gate output (node "B"). The first-NAND-gate output (node "B") may be coupled to the first latch input (204; 304) through a transmission gate between node "B" and output 454. The first-NAND-gate first input (between nodes "A" and "B" illustrated in FIG. 4) may be configured to receive the data input (218; 318) and the shift input (222; 322).

The selection component (216; 316) may also include a second NAND-gate (226; 326) having a second-NAND-gate first input, a second-NAND-gate second input, and a second-NAND-gate output. The second-NAND-gate output may be coupled to the first-NAND-gate second input (452). The second-NAND-gate first input may be coupled to the shift input (222; 322). The second-NAND-gate second input may be configured to receive the scan input (220; 320).

Additionally, the selection component (216; 316) may include an OR-gate (228; 328; 470) having an OR-gate first input (472), an OR-gate second input (474), and an OR-gate output (476). The OR-gate output (476) may be coupled to the first-NAND-gate first input (between nodes "A" and "B"). The OR-gate first input (472) may be coupled to the data input (218; 318). The OR-gate second input (474) may be coupled to the shift input (222; 322).

Some examples may further include an inverter (229) having an inverter input and an inverter output. The inverter input may be coupled to the scan input (220; 320). The inverter output may be coupled to the second-NAND-gate second input. In some examples, the inverter may include a plurality of stacked pMOS transistors (276) in series, and a plurality of stacked nMOS transistors (278) in series.

In some examples, the second latch (208; 308) includes a first transmission gate (240; 340; 540) coupled between the second latch input (210; 310) and a first node (246; 346). A first inverter (242; 342; 542) is coupled between the first node (246; 346) and a second node (248; 348). Additionally, a second inverter (244; 344) is coupled to the second node (248; 348) and the second latch scan output (212; 312). As described above with respect to FIG. 5, the second inverter (344) may generally be implemented using transistors (552, 554). A second transmission gate (354) may be coupled between the second latch scan output (312) and the first node (346). As described above with respect to FIG. 5, the second transmission gate (354) may generally be implemented using transistors (556, 558). The second latch (208; 308) may further include a third inverter (250; 350; 560) coupled between the second node (248; 348) and the second latch data output (214; 314).

As described herein, some example flip-flop designs may include an inverter (229) having an inverter input and an inverter output. The inverter input may be coupled to the scan input. The inverter output may be coupled to the second-NAND-gate second input. The example of FIG. 3 does not illustrate an inverter in the selection component (316). It will be understood, however, that in another example, the flip-flop design of FIG. 3 may include an inverter between scan input (320) and the second input to NAND gate (326).

In some examples, the second NAND-gate (226; 326) may include at least one pMOS transistor (256) coupled to the shift input (222). The second NAND-gate (226; 326) may also include a set of pMOS transistors (258) coupled to the scan input (220; 320) (sin/sin). The second NAND-gate (226; 326) may include at least one nMOS transistor (260) coupled to the shift input (222). The second NAND-gate (226; 326) may further include a set of nMOS transistors (262) coupled to the scan input (220; 320) (sin/sin). The set of pMOS transistors (258) coupled to the scan input (220; 320) may be stacked in series as illustrated in FIG. 2B. The set of nMOS transistors (262) coupled to the scan input (220; 320) may be stacked in series as illustrated in FIG. 2B.

Figure 6:
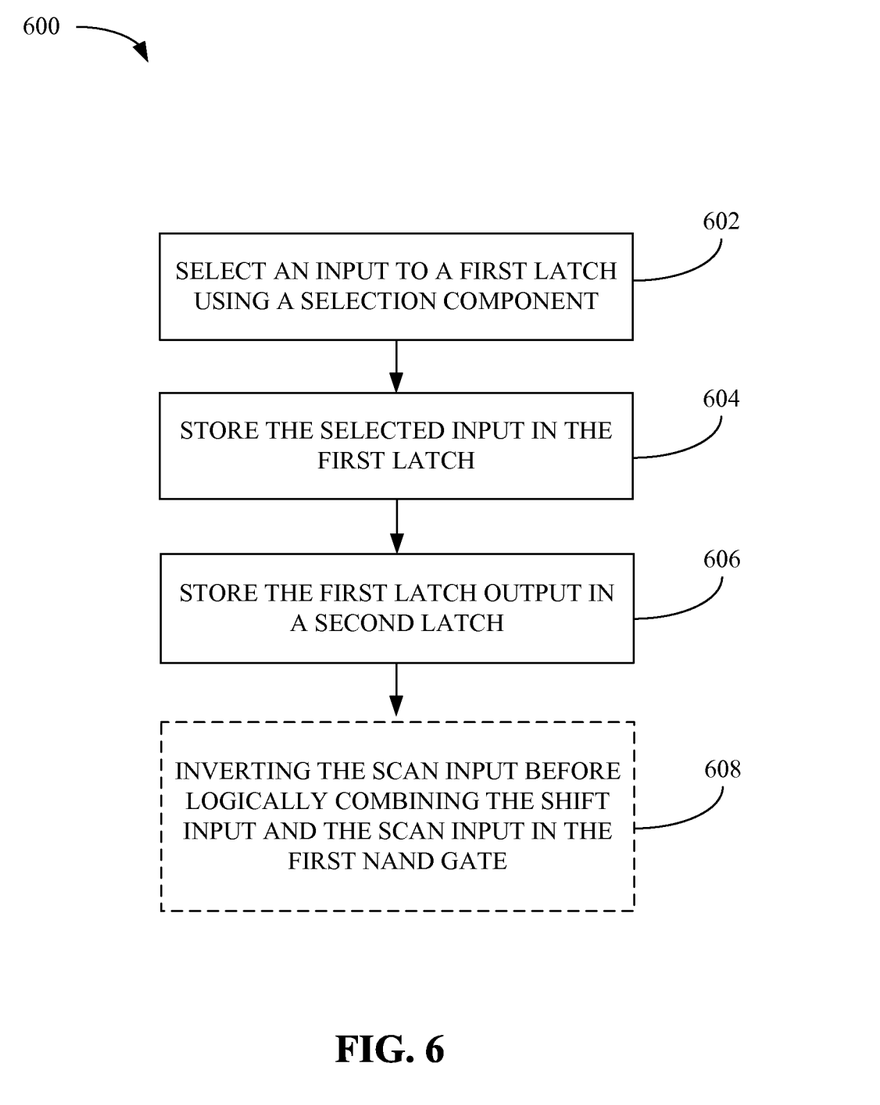
FIG. 6 is a flowchart of an exemplary method of a flip-flop circuit in accordance with this disclosure.

FIG. 6 is a flowchart 600 of an exemplary method of a flip-flop circuit in accordance with this disclosure. In a block 602, select an input to a first latch (202; 302), e.g., using a selection component (216, 316). The first latch (202; 302) has a first latch input (204; 304). The input to the first latch input (204; 304) is selected from a data input (218; 318) and a scan input (220; 320) based on a shift input (222; 322). In the illustrated example of FIG. 6, selecting an input to a first latch (202; 302) is performed using a selection component (216; 316). The selection component (216; 316) may be configured to logically combine the shift input (222; 322) and the scan input (220; 320) in a second NAND-gate (226; 326) to generate a first intermediate signal. The selection component (216; 316) may also be configured to logically combining the shift input (222; 322) and the data input (218; 318) in an OR-gate (228; 328) to generate a second intermediate signal. Additionally, the selection component (216; 316) may be further configured to logically combining the first intermediate signal and the second intermediate signal in a first NAND-gate (224; 324; 450) to generate said selected input. (Depending on the order of introduction of components in the claims. the first NAND gate 234; 324 may be referred to as the "second NAND gate" in some of the claims. Similarly, the second NAND gate 236; 326 may be referred to as the "first NAND gate" in some of the claims.)

In some examples, the selecting component (216; 316) may be coupled to the first latch input (204; 304). The selection component (216; 316) may include the first NAND-gate (224; 324; 450). The first NAND-gate (224; 324; 450) may have a first-NAND-gate first input (between nodes "A" and "B" illustrated in FIG. 4), a first-NAND-gate second input (452), and a first-NAND-gate output (node "B"). Additionally, the first-NAND-gate output (node "B") may be coupled to the first latch input (204; 304), e.g., through a transmission gate between node "B" and output 454. Furthermore, the first-NAND-gate first input (between nodes "A" and "B" illustrated in FIG. 4) may be configured to receive the data input (218; 318) and the shift input (222; 322).

The selection component (216; 316) may include the second NAND-gate (226; 326). The second NAND-gate (226; 326) may have a second-NAND-gate first input, a second-NAND-gate second input, and a second-NAND-gate output. Additionally, the second-NAND-gate output may be coupled to the first-NAND-gate second input. Furthermore, the second-NAND-gate first input may be coupled to the shift input. The second-NAND-gate second input may be configured to receive the scan input.

The selection component (216; 316) may include the OR-gate (228; 328; 470). The OR-gate (228; 328; 470) may have an OR-gate first input (472), an OR-gate second input (474), and an OR-gate output (476). Additionally, the OR-gate output (476) may be coupled to the first-NAND-gate first input (between nodes "A" and "B"). Furthermore, the OR-gate first input (472) may be coupled to the data input (218; 318). The OR-gate second input (474) may be coupled to the shift input (222; 322).

Some examples may invert the scan input (220) before logically combining the shift input (222) and the scan input (220) in the first NAND-gate (224; between nodes "A" and "B" illustrated in FIG. 4). The inverting may be performed by an inverter (229) having an inverter input (272) and an inverter output (276). Additionally, the inverter input (272) may be coupled to the scan input (220; 320). Furthermore, the inverter output (276) may be coupled to the second-NAND-gate second input. In some examples, the inverter (229) includes a plurality of stacked pMOS transistors (258) in series and a plurality of stacked nMOS transistors (262) in series.

In a block 604, store the selected input in the first latch (202; 302). The first latch (202; 302) has a first latch output that is coupled to a second latch (208; 308).

In a block 606, store the first latch output in the second latch (208; 308) coupled to the first latch (202; 302), e.g., using second latch 208; 308. The second latch (208; 308) may have a second latch input, a second latch scan output, and a second latch data output. The second latch input may be coupled to the first latch output.

In some examples, the second latch (208; 308) includes a first transmission gate (240; 340) coupled between the second latch input and a first node (246; 346). The second latch (208; 308) may further include a first inverter (242; 342) coupled between the first node (246; 346) and a second node (248; 348). The second latch (208; 308) may also include a second inverter (244; 344) coupled to the second node (248; 348) and the second latch scan output (212; 312). The second latch (308) may further include a second transmission gate (354) coupled between the second latch scan output and the first node (346). Some examples may invert the scan input before logically combining the shift input (222; 322) and the scan input (220; 320) in the second NAND-gate (226; 326), as shown in block 608. The inverting may be performed by an inverter (229) having an inverter input and an inverter output. The inverter input may be coupled to the scan input (220). Additionally, the inverter output may be coupled to the second-NAND-gate second input.

In some examples, the second latch (208; 308) may further include a third inverter (250; 350). The third inverter (250; 350) may be coupled between the second node (248; 348) and the second latch data output (214; 314).

In some examples, the second NAND-gate (226; 326) may include at least one pMOS transistor (256) coupled to the shift input. The second NAND-gate (226; 326) may also include a set of pMOS transistors (258) coupled to the scan input (220; 320). The second NAND-gate (226; 326) may further include at least one nMOS transistor (260) coupled to the shift input (222; 322). The second NAND-gate (226; 326) may also include a set of nMOS transistors (262) coupled to the scan input (220; 320). The set of pMOS transistors (258) coupled to the scan input (220; 320) is stacked in series and the set of nMOS transistors (262) coupled to the scan input (220; 320) is stacked in series.

The systems and apparatus described herein may include means (216; 316) for selecting an input to a first latch (202; 302). The first latch has a first latch input (204; 304). The input is selected from a data input (218; 318) and a scan input (220; 320) based on a shift input (222; 322). Additionally, the systems and apparatus described herein may include means for storing the selected input in the first latch (202; 302). The means for storing the selected input in the first latch may be the first latch (202; 302) itself. The first latch (202; 302) may have a first latch output (206; 306). The systems and apparatus described herein may also include means for storing the first latch output (206; 306) in a second latch (208; 308). The second latch (208; 308) may be coupled to the first latch (202; 302). The means for storing the first latch output (206; 306) in a second latch (208; 308) may be the second latch (208; 308) itself.

In some examples, the means for selecting an input to a first latch (216; 316) may logically combining the shift input (222; 322) and the scan input (220; 320) in a second NAND-gate (226; 326) to generate a first intermediate signal. Additionally, the means for selecting an input to a first latch (216; 316) may logically combine the shift input (222; 322) and the data input (218; 318) in an OR-gate (228; 328; 470) to generate a second intermediate signal. The means for selecting an input to a first latch (216; 316) may also logically combining the first intermediate signal and the second intermediate signal in a first NAND-gate (224; 324; 450) to generate the selected input that is coupled to the first latch input (204; 304).

In some examples, the means for selecting an input to a first latch (216; 316) may include a selection component (216; 316). The selection component (216; 316) may be coupled to the first latch input (204; 304). Additionally, the selection component (216; 316) may include the first NAND-gate (224; 324; 450). The first NAND gate may have a first-NAND-gate first input (between nodes "A" and "B"), a first-NAND-gate second input 452, and a first-NAND-gate output (node "B"). The first-NAND-gate output (node "B") may be coupled to the first latch input (204; 304), e.g., through a transmission gate between node "B" and output 454. The first-NAND-gate first input (between nodes "A" and "B") may be configured to receive the data input (218; 318) and the shift input (220; 320).

Furthermore, the selection component (216; 316) may include the second NAND-gate (226; 326). The second NAND-gate (226; 326) may have a second-NAND-gate first input, a second-NAND-gate second input, and a second-NAND-gate output. The second-NAND-gate output may be coupled to the first-NAND-gate second input (452). The second-NAND-gate first input may be coupled to the shift input (222; 322). Additionally, the second-NAND-gate second input may be configured to receive the scan input (220; 320).

Additionally, the selection component may include the OR-gate (228; 328; 470). The OR-gate (228; 328; 470) may have an OR-gate first input (472), an OR-gate second input (474), and an OR-gate output (476). The OR-gate output (476) may be coupled to the first-NAND-gate first input (between nodes "A" and "B"). The OR-gate first input (472) may be coupled to the data input (218; 318). The OR-gate second input (474) may be coupled to the shift input (222; 322).

The systems and apparatus described herein may also include means for inverting the scan input (229) before logically combining the shift input (222; 322) and the scan input (220) in the first NAND-gate (224; 324; 450). The means for inverting the scan input (229) may be an inverter (229). The inverter (229) may have an inverter input (272) and an inverter output (276). The inverter input (272) may be coupled to the scan input (220). The inverter output (276) may be coupled to the second-NAND-gate second input. In some examples, the inverter (229) includes a plurality of stacked pMOS transistors (276) in series, and a plurality of stacked nMOS transistors (278) in series.

In some examples, the second latch (208; 308) includes a first transmission gate (240; 340). The first transmission gate (240; 340) may be coupled between the second latch input (210; 310) and a first node (246; 346). The second latch (208; 308) also includes a first inverter (242; 342) coupled between the first node (246; 346) and a second node (248; 348). Additionally, the second latch (208; 308) also includes a second inverter (244; 344) coupled to the second node (248; 348) and the second latch scan output (212; 312). Furthermore, in some examples, the second latch (308)

includes a second transmission gate (354) coupled between the second latch scan output (312) and the first node (346).

The systems and apparatus described herein may also include means for inverting (229) the scan input (220) before logically combining the shift input (222) and the scan input (220) in the first NAND-gate (224; 450). In some examples, the means for inverting (229) is an inverter (229) having an inverter input (272) and an inverter output (276). The inverter input (272) may be coupled to the scan input (220). The inverter output (276) may be coupled to the second-NAND-gate second input.

In some examples, the second latch (208; 308) may further include a third inverter (250; 350) coupled between the second node (248; 348) and the second latch data output (214; 314).

The second NAND-gate (226; 326) may include at least one pMOS transistor (256) coupled to the shift input. A set of pMOS transistors (258) may be coupled to the scan input (220; 320). At least one nMOS transistor (252) may be coupled to the shift input (222; 322). A set of nMOS transistors (262) may be coupled to the scan input (220; 320). The set of pMOS transistors (258) coupled to the scan input may be stacked in series. The set of nMOS transistors (262) coupled to the scan input may be stacked in series.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
    a first latch having a first latch input and first latch output, the first latch including a first latch transmission gate, a first latch inverter, and a first latch clocked inverter, the first latch transmission gate coupled directly to the first latch inverter;
    a second latch having a second latch input, a second latch scan output, and a second latch data output, the second latch input having a direct logical connection to the first latch output, the second latch comprising:
        a first transmission gate coupled between the second latch input and a first node,
        a first inverter coupled between the first node and a second node,
        a second inverter coupled between the second node and the second latch scan output, and
        a second transmission gate coupled between the second latch scan output and the first node;
    a selection component configured to select between a data input and a scan input based on a shift input, the selection component comprising:
    a first NAND-gate having a first-NAND-gate first input, a first-NAND-gate second input, and a first-NAND-gate output, the first-NAND-gate output being configured to be coupled to the first latch input, the first-NAND-gate first input being configured to receive the data input and the shift input;
    a second NAND-gate having a second-NAND-gate first input, a second-NAND-gate second input, and a second-NAND-gate output, the second-NAND-gate output being coupled to the first-NAND-gate second input, the second-NAND-gate first input being coupled to the shift input, the second-NAND-gate second input being configured to receive the scan input; and
    an OR-gate having an OR-gate first input, an OR-gate second input, and an OR-gate output, the OR-gate output being coupled to the first-NAND-gate first input, the OR-gate first input being coupled to the data input, the OR-gate second input being coupled to the shift input; and
    an inverter having an inverter input and an inverter output, the inverter input being coupled to the scan input, the inverter output being coupled to the second-NAND-gate second input,
    wherein the direct logical connection comprises a direct logical connection between the first latch inverter and the first transmission gate of the second latch, and wherein the second NAND-gate comprises one p-type MOS (pMOS) transistor coupled to the shift input, a set of pMOS transistors coupled to the scan input, one n-type MOS (nMOS) transistor coupled to the shift input, and a set of nMOS transistors coupled to the scan input, wherein the set of pMOS transistors coupled to the scan input is stacked in series, and the set of nMOS transistors coupled to the scan input is stacked in series, and wherein the one pMOS transistor coupled to the shift input is unstacked and the one nMOS transistor coupled to the shift input is unstacked.

2. The apparatus of claim 1, wherein the second latch further comprises a third inverter coupled between the second node and the second latch data output.

3. A method of a flip-flop circuit, comprising:
selecting an input to a first latch, the first latch having a first latch input, the input being selected from a data input and a scan input based on a shift input, the selecting being performed by a selection component, the selection component being coupled to the first latch input, and the selection component comprising:
  a first NAND-gate having a first-NAND-gate first input, a first-NAND-gate second input, and a first-NAND-gate output, the first-NAND-gate output being coupled to the first latch input, the first-NAND-gate first input being configured to receive the data input and the shift input;
  a second NAND-gate having a second-NAND-gate first input, a second-NAND-gate second input, and a second-NAND-gate output, the second-NAND-gate output being coupled to the first-NAND-gate second input, the second-NAND-gate first input being coupled to the shift input, the second-NAND-gate second input being configured to receive the scan input, wherein the second NAND-gate comprises one p-type MOS (pMOS) transistor coupled to the shift input, a set of pMOS transistors coupled to the scan input, one n-type MOS (nMOS) transistor coupled to the shift input, and a set of nMOS transistors coupled to the scan input, wherein the set of pMOS transistors coupled to the scan input is stacked in series, and the set of nMOS transistors coupled to the scan input is stacked in series, and wherein the one pMOS transistor coupled to the shift input is unstacked and the one nMOS transistor coupled to the shift input is unstacked; and
  an OR-gate having an OR-gate first input, an OR-gate second input, and an OR-gate output, the OR-gate output being coupled to the first-NAND-gate first input, the OR-gate first input being coupled to the data input, the OR-gate second input being coupled to the shift input;
storing the selected input in the first latch, the first latch having a first latch output, the first latch including a first latch transmission gate, a first latch inverter, and a first latch clocked inverter, the first latch transmission gate coupled directly to the first latch inverter;
inverting the scan input before logically combining the shift input and the scan input in the first NAND-gate; and
storing the first latch output in a second latch having a direct logical connection to the first latch, the second latch having a second latch input, a second latch scan output, and a second latch data output, the second latch input being coupled to the first latch output, the second latch comprises:
  a first transmission gate coupled between the second latch input and a first node; a first inverter coupled between the first node and a second node;
  a second inverter coupled between the second node and the second latch scan output; and
  a second transmission gate coupled between the second latch scan output and the first node,
wherein the selecting comprises:
  logically combining the shift input and the scan input in the first NAND-gate to generate a first intermediate signal;
  logically combining the shift input and the data input in the OR-gate to generate a second intermediate signal; and
  logically combining the first intermediate signal and the second intermediate signal in the second NAND-gate to generate the selected input,
wherein the direct logical connection comprises a direct logical connection between the first latch inverter and the first transmission gate of the second latch.

4. The method of claim 3, wherein the inverting is performed by an inverter having an inverter input and an inverter output, the inverter input being coupled to the scan input, the inverter output being coupled to the second-NAND-gate second input.

5. The method of claim 3, wherein the second latch further comprises a third inverter coupled between the second node and the second latch data output.

6. An apparatus comprising:
means for selecting an input to a first latch, the first latch having a first latch input, the input being selected from a data input and a scan input based on a shift input;
means for storing the selected input in the first latch, the first latch having a first latch output, the first latch including a first latch transmission gate, a first latch inverter, and a first latch clocked inverter, the first latch transmission gate coupled directly to the first latch inverter; and
means for storing the first latch output in a second latch having a direct logical connection to the first latch, the second latch having a second latch input, a second latch scan output, and a second latch data output, the second latch comprising:
  a first transmission gate coupled between the second latch input and a first node,
  a first inverter coupled between the first node and a second node,
  a second inverter coupled between the second node and the second latch scan output, and
  a second transmission gate coupled between the second latch scan output and the first node, the second latch input being coupled to the first latch output, the selecting being performed by a selection component, the selection component being coupled to the first latch input, and the selection component comprising:
    a first NAND-gate having a first-NAND-gate first input, a first-NAND-gate second input, and a first-NAND-gate output, the first-NAND-gate output being coupled to the first latch input, the first-NAND-gate first input being configured to receive the data input and the shift input;
    a second NAND-gate having a second-NAND-gate first input, a second-NAND-gate second input, and a second-NAND-gate output, the second-NAND-gate output being coupled to the first-NAND-gate second input, the second-NAND-gate first input being coupled to the shift input, the second-NAND-gate second input being configured to receive the scan input, wherein the second NAND-gate comprises one p-type MOS (pMOS) transistor coupled to the shift input, a set of pMOS transistors coupled to the scan input, one n-type MOS (nMOS) transistor coupled to the shift input, and a set of nMOS transistors coupled to the scan input, wherein the set of pMOS transistors coupled to the scan input is stacked in series, and the set of nMOS transistors coupled to the scan input is stacked in series, and wherein the one pMOS transistor coupled to the shift input is unstacked and the one nMOS transistor coupled to the shift input is unstacked; and an OR-gate having an OR-gate first input, an OR-gate second input, and an OR-gate output, the OR-gate output being coupled to the first-NAND-gate first input, the OR-gate first input being coupled to the data input, the OR-gate second input being coupled to the shift input;

wherein the means for selecting comprises:
means for logically combining the shift input and the scan input in the first NAND-gate to generate a first intermediate signal;
means for logically combining the shift input and the data input in the OR-gate to generate a second intermediate signal;
means for logically combining the first intermediate signal and the second intermediate signal in the second NAND-gate to generate the selected input; and means for inverting the scan input before logically combining the shift input and the scan input in the first NAND-gate,
wherein the direct logical connection comprises a direct logical connection between the first latch inverter and the first transmission gate of the second latch.

7. The apparatus of claim 6, wherein the means for inverting includes an inverter having an inverter input and an inverter output, the inverter input being coupled to the scan input, the inverter output being coupled to the second-NAND-gate second input.

8. The apparatus of claim 6, wherein the second latch further comprises a third inverter coupled between the second node and the second latch data output.

* * * * *